(12) United States Patent
Hsu et al.

(10) Patent No.: US 6,351,429 B1
(45) Date of Patent: Feb. 26, 2002

(54) BINARY TO BINARY-ENCODED-TERNARY (BET) DECODER USING REORDERED LOGIC

(75) Inventors: Louis L. Hsu, Fishkill; Dmitry Netis, Brooklyn, both of NY (US); John M. Ross, Aberdeen, NJ (US)

(73) Assignee: International Business Machines Corp., Armonk, NY (US)

( * ) Notice: Subject to any disclaimer, the term of this patent is extended or adjusted under 35 U.S.C. 154(b) by 0 days.

(21) Appl. No.: 09/607,097

(22) Filed: Jun. 29, 2000

(51) Int. Cl.[7] .......................... G11C 8/00; G11C 11/56
(52) U.S. Cl. ................... 365/230.06; 365/168
(58) Field of Search ............... 365/230.06, 168, 365/49, 230.04, 230.01

(56) References Cited

U.S. PATENT DOCUMENTS

| | | | | |
|---|---|---|---|---|
| 5,287,305 A | * | 2/1994 | Yoshida | 365/189.01 |
| 5,432,735 A | * | 7/1995 | Parks et al. | 365/168 |
| 5,841,874 A | * | 11/1998 | Kempke et al. | 380/50 |
| 5,920,886 A | * | 7/1999 | Feldmeier | 711/108 |
| 6,108,227 A | * | 8/2000 | Voelkel | 365/49 |

\* cited by examiner

*Primary Examiner*—Vu A. Le
*Assistant Examiner*—Anh Phung
(74) *Attorney, Agent, or Firm*—Scully, Scott, Murphy & Presser; Daryl K. Neff, Esq.

(57) ABSTRACT

An integrated circuit memory device comprising an arrangement of physical wordlines, WL0–WLn, arrange such that each wordline is addressed by a plurality of pairs, An+1, An, of logical row address bits, and such that at least one pair of logical row address bits, corresponding to physically adjacent wordlines Wlm, Wlm+1, Wlm+2 in succession, cycles between binary states which encode the ternary results A, B and C in succession. The ternary results A, B or C are used to determine which two bitlines of a possible three bitlines are selected by a multiplexer which connects the bitlines to a sense amplifier for determining the state of a bit stored in a memory cell accessed by an activated wordline and a selected bitline. Preferably, the ternary results A, B and C are respectively encoded by said binary states of said pair of logical row address bits, said binary states being "00," "01," and "10" respectively.

12 Claims, 11 Drawing Sheets

| Logical Address | | Physical Address | | |
|---|---|---|---|---|
| Binary | Decimal | Binary | Decimal | ABC |
| 0000 | 0 | 0000 | 0 | A |
| 0001 | 1 | 0001 | 1 | B |
| 0010 | 2 | 0010 | 2 | C |
| 0011 | 3 | 1100 | 12 | A |
| 0100 | 4 | 0011 | 3 | A |
| 0101 | 5 | 0100 | 4 | B |
| 0110 | 6 | 0101 | 5 | C |
| 0111 | 7 | 1101 | 13 | B |
| 1000 | 8 | 0110 | 6 | A |
| 1001 | 9 | 0111 | 7 | B |
| 1010 | 10 | 1000 | 8 | C |
| 1011 | 11 | 1110 | 14 | C |
| 1100 | 12 | 1001 | 9 | A |
| 1101 | 13 | 1010 | 10 | B |
| 1110 | 14 | 1011 | 11 | C |
| 1111 | 15 | 1111 | 15 | A |

Figure 3

Non-Reordered

⋮

Reordered

⋮

| | | | | | | | | | | | | | | ... | |
|---|---|---|---|---|---|---|---|---|---|---|---|---|---|---|---|
| Logic Function A | $S_0$ | 1 | 1 | 1 | 0 | 0 | 0 | 0 | 0 | 0 | 0 | 0 | 0 | ... | 0 |
| | $S_1$ | 0 | 0 | 0 | 1 | 1 | 1 | 0 | 0 | 0 | 0 | 0 | 0 | ... | 0 |
| | $S_2$ | 0 | 0 | 0 | 0 | 0 | 0 | 1 | 1 | 1 | 0 | 0 | 0 | ... | 0 |
| | $S_3$ | 0 | 0 | 0 | 0 | 0 | 0 | 0 | 0 | 0 | 1 | 1 | 1 | ... | 0 |
| | $S_4$ | 0 | 0 | 0 | 0 | 0 | 0 | 0 | 0 | 0 | 0 | 0 | 0 | ... | 0 |
| | ⋮ | ⋮ | ⋮ | ⋮ | ⋮ | ⋮ | ⋮ | ⋮ | ⋮ | ⋮ | ⋮ | ⋮ | ⋮ | | ⋮ |
| | $S_x^a$ | 0 | 0 | 0 | 0 | 0 | 0 | 0 | 0 | 0 | 0 | 0 | 0 | ... | 1 |
| Input Address | $A_0$ | 0 | 1 | 0 | 1 | 1 | 1 | 1 | 1 | 1 | 1 | 1 | 1 | ... | 1 |
| | $A_1$ | 0 | 0 | 1 | 1 | 1 | 1 | 1 | 1 | 1 | 1 | 1 | 1 | ... | 1 |
| | $A_2$ | X | X | X | 0 | 1 | 0 | 1 | 1 | 1 | 1 | 1 | 1 | ... | 1 |
| | $A_3$ | X | X | X | 0 | 0 | 1 | 1 | 1 | 1 | 1 | 1 | 1 | ... | 1 |
| | $A_4$ | X | X | X | X | X | X | 0 | 1 | 0 | 1 | 1 | 1 | ... | 1 |
| | $A_5$ | X | X | X | X | X | X | 0 | 0 | 1 | 1 | 1 | 1 | ... | 1 |
| | $A_6$ | X | X | X | X | X | X | X | X | X | 0 | 1 | 0 | ... | 1 |
| | $A_7$ | X | X | X | X | X | X | X | X | X | 0 | 0 | 1 | ... | 1 |
| | ⋮ | ⋮ | ⋮ | ⋮ | ⋮ | ⋮ | ⋮ | ⋮ | ⋮ | ⋮ | ⋮ | ⋮ | ⋮ | | ⋮ |
| | $A_{n-1}$ | X | X | X | X | X | X | X | X | X | X | X | X | ... | 1 |

Figure 6

If either $A_0$, $A_1$ are high then S is high, but not when both $A_0$, $A_1$ are high.

| Input | | | | | | | Logic Function B | |
|---|---|---|---|---|---|---|---|---|
| $S_x^a$ | ... | $S_4$ | $S_3$ | $S_2$ | $S_1$ | $S_0$ | Q | P |
| 0 | ... | 0 | 0 | 0 | 0 | 1 | $A_1$ | $A_0$ |
| 0 | ... | 0 | 0 | 0 | 1 | 0 | $A_3$ | $A_2$ |
| 0 | ... | 0 | 0 | 1 | 0 | 0 | $A_5$ | $A_4$ |
| 0 | ... | 0 | 1 | 0 | 0 | 0 | $A_7$ | $A_6$ |
| 0 | ... | 1 | 0 | 0 | 0 | 0 | $A_9$ | $A_8$ |
| $1^b$ | ... | 0 | 0 | 0 | 0 | 0 | 0 | 0 |
| $1^c$ | ... | 0 | 0 | 0 | 0 | 0 | 0 | $A_{N-1}$ |

Table 4: Truth table for Logic function B.

a. For even n, x = n/2. For odd n, x = (n-1)/2.
b. For even n.
c. For odd n.

Logic B1

US 6,351,429 B1

BINARY TO BINARY-ENCODED-TERNARY (BET) DECODER USING REORDERED LOGIC

BACKGROUND OF THE INVENTION

This invention generally relates to binary to binary-encoded-ternary decoding. More specifically, the invention relates to the use of such decoding for the purpose of accessing memory cells.

The quest to increase the density of Dynamic Random Access Memory (DRAM) arrays has produced an array cell layout featuring a $6F^2$ cell, as shown in FIG. 1. The dark circles at the intersections, or crosspoints, of the word-lines and bit-lines represent memory cells. The dashed boxes labeled 1 and 2 highlight the repeating pattern of memory cells in the directions of the word-lines and bit-lines respectively. The word-lines within this unit of periodicity have been labeled A, B and C. Thus, during a memory array access, the multiplexer (MUX) control must select a unique pair of bit-lines dependent upon the A, B, C position of the activated word-line. In particular, at position A, bit-lines X and Z are selected; at position B, bit-lines X and Y are selected; and at position C, bit-lines Y and Z are selected.

It is readily apparent that this information is available as the remainder of a divide-by-three operation on the numerical value of the undecoded word-line address. For example, for word-line 0, the remainder of 0/3 is 0, which corresponds to position A. Similarly, for word-line 7, the remainder of 7/3 is 1, which corresponds to position B. FIG. 2 shows prior art examples that utilize this property, in what are referred to as binary to ternary decoders. More accurately, these decoders should be called binary to binary-encoded-ternary (BET) decoders, since they are implemented in two-state logic systems, while true ternary representation requires three state logic.

SUMMARY OF THE INVENTION

An object of this invention is to provide a procedure and associated circuitry, to perform binary to binary-encoded ternary (BET) decoding of an n-bit binary word.

Another object of the present invention is to provide a procedure, and associated circuitry, to perform binary to BET decoding that does not utilize division-by-3.

A further object of this invention is to provide an improved procedure for identifying memory cells to be accessed in a memory device.

These and other objectives are attained with an integrated circuit memory device comprising an arrangement of physical wordlines, WL0–WLn, arranged such that each wordline is addressed by a plurality of pairs, An+1, An, of logical row address bits, and such that at least one pair of logical row address bits, corresponding to physically adjacent wordlines Wlm, Wlm+1, Wlm+2 in succession, cycles between binary states which encode the ternary results A, B and C in succession. The ternary results A, B or C are used to which two bitlines of a possible three bitlines are selected by a multiplexer which connects the bitlines to a sense amplifier for determining the state of a bit stored in a memory cell accessed by an activated wordline and a selected bitline. Preferably, the ternary results A, B and C are respectively encoded by said binary states of said pair of logical row address bits, said binary states being "00," "01," and "10" respectively.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 3 shows a table that may be used to reorder wordline addresses in accordance with the present invention.

FIG. 6 is a truth table illustrating a first logic function used in the preferred embodiment of this invention.

DETAILED DESCRIPTION OF THE PREFERRED EMBODIMENTS

The present invention is a wholly new approach to binary to BET decoding that does not utilize division-by-three. Instead, a logical to physical reordering of the wordlines is implemented that allows the ABC information to always be extracted from one pair of the input binary digits. For an input binary address of n digits, the complete set of wordlines numbers 0 to ($2^n$–1). The physical assignment of these $2^n$ logical wordlines is therefore reordered to simplify the ABC decoding procedure.

Table 1 in FIG. 3 illustrates a logical to physical reordering of the decoded wordlines for a 4-bit wordline address. The logical address is the wordline address applied to the wordline decoder. The physical address is the actual wordline that is activated after decoding. This refers to the physical positioning of the wordline relative to a reference wordline. For example, sixteen wordlines may be arranged in a regular pattern with one singly adjacent wordline designated as wordline 0, the first adjacent wordline designated as wordline 1, the second adjacent wordline designated as wordline 2, and so on until all sixteen wordlines are designated. When logical address $310$ (the subscript indicates the numerical base) is applied to the wordline decoder, the twelfth adjacent physical wordline is activated. The ABC column of Table 1 indicates the state that the binary to BET decoder must produce for the given logical address.

It may be noted that a logical to physical address conversion need not be explicitly produced because the reordering can be hidden in the wordline decoder logic. FIG. 4 shows a logical representation of a wordline decoder for the non-reordered and reordered cases. The 4-bit address $A_3-A_0$ is the logical wordline address. The wordlines $WL_n$ are the physical wordline locations. This shows that the reordering is accomplished with a simple rewiring of the input address.

Figure 1:
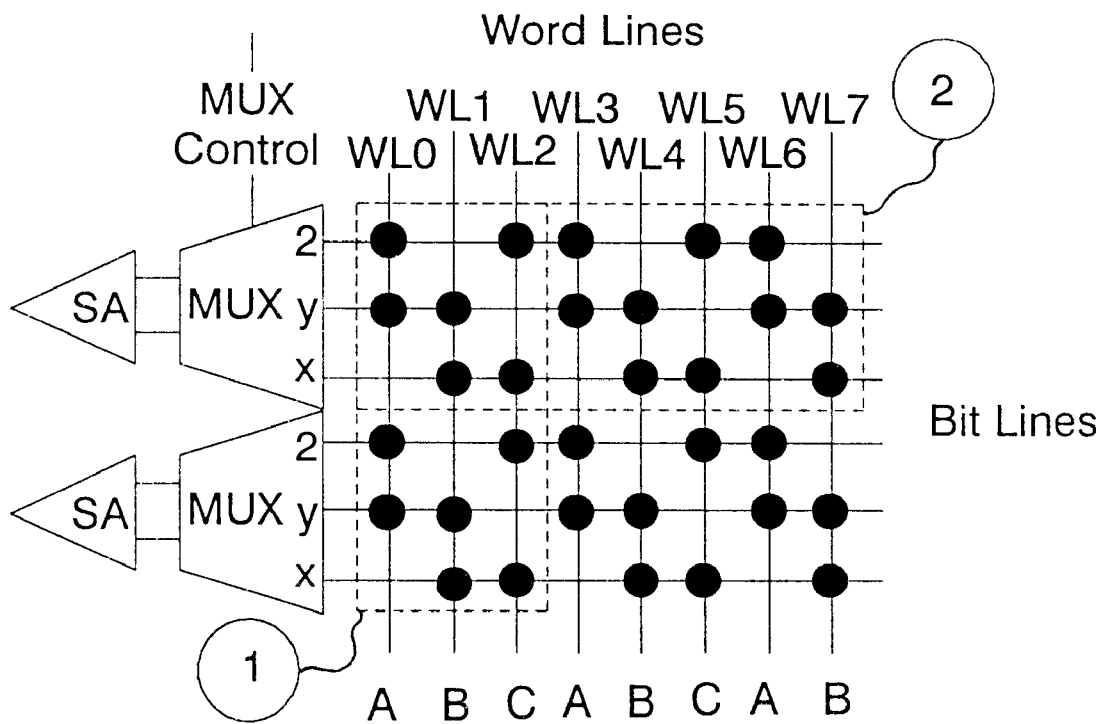
FIG. 1 shows a memory device with which the present invention may be used.
Figures 2A, 2B:
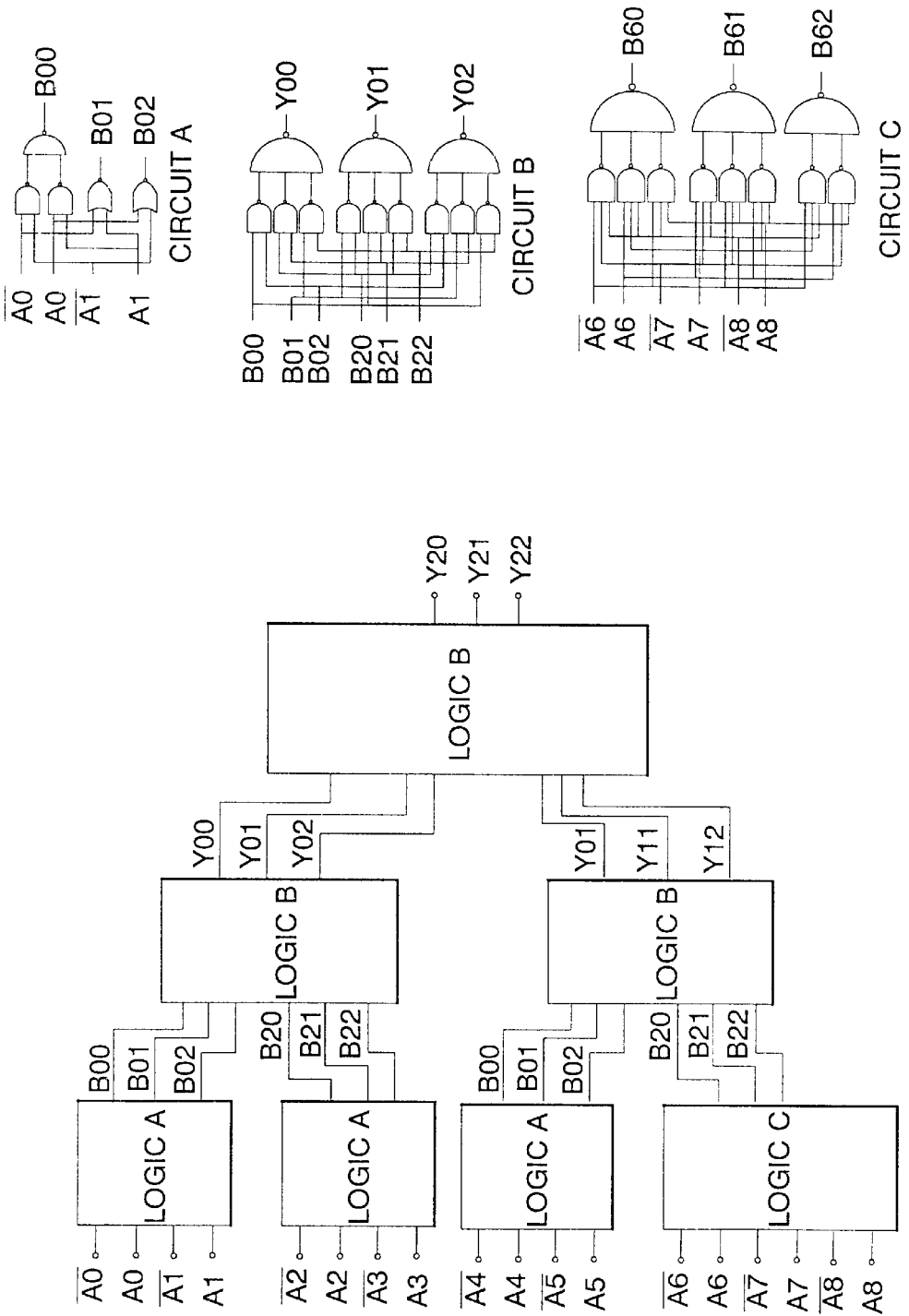
FIG. 2 shows a prior art devices that utilize binary to ternary decoders.
Figure 4A:
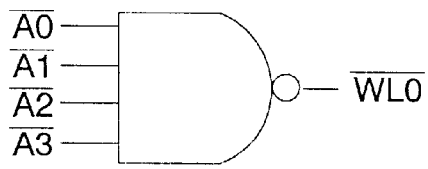
FIG. 4 shows a logical representation of a wordline decoder for the non-reordered and reordered cases.
Figure 4A:
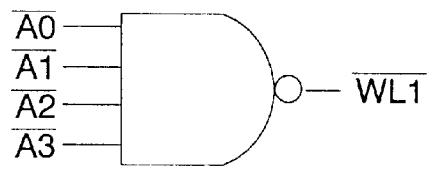
Figure 4A:
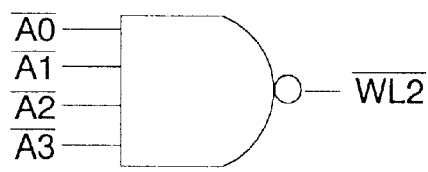
Figure 4A:
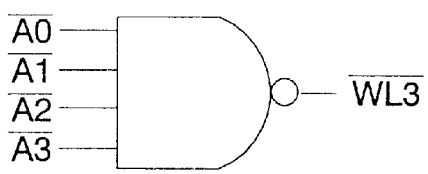
Figure 4A:
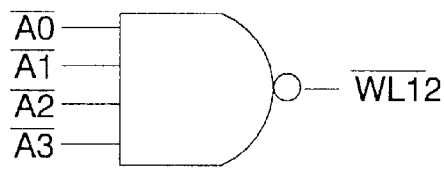
Figure 4B:
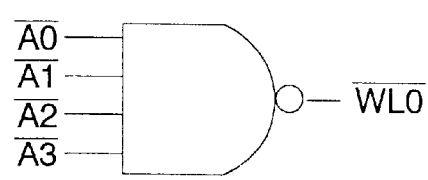
Figure 4B:
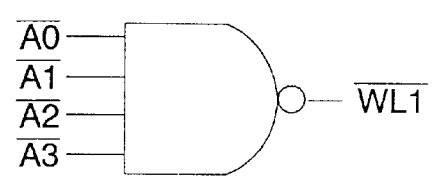
Figure 4B:
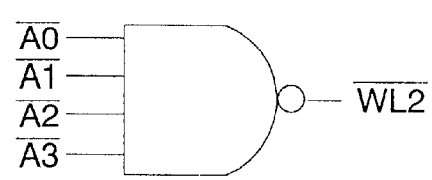
Figure 4B:
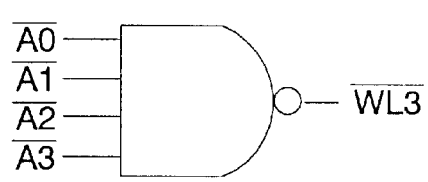
Figure 4B:
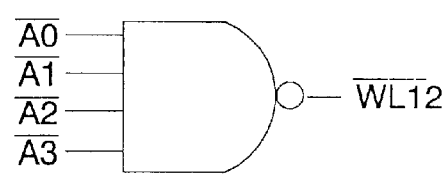
Figure 5:
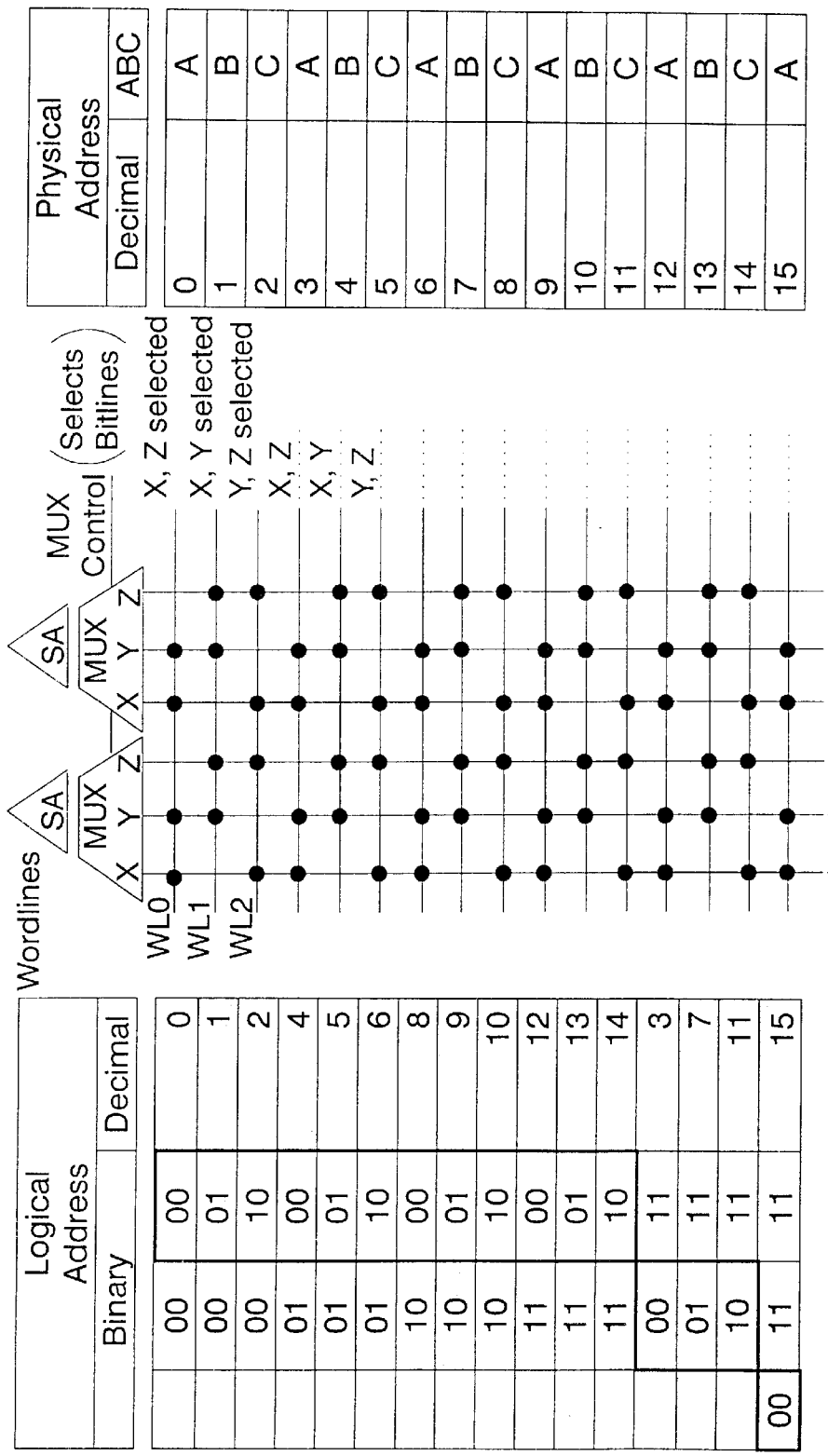
FIG. 5 illustrates the by-3 periodicity in the reordered logical addresses.

The advantage of this reordering scheme will be apparent from FIG. 5, which highlights a by-3 periodicity in the reordered logical address that precisely corresponds to the physical periodicity of the array as shown in the Figure. For physical wordlines 0–11, the ABC decoding is made on the basis of the two least-significant digits of the logical address, as highlighted in the table. The value of these two digits cycles through $00_2$, $01_2$, $10_2$, which can directly be assigned correspondence to A,B,C. For physical wordlines 12–14, the two least significant digits are always $11_2$. For this condition, the ABC decoding is made on the basis of the third and fourth least-significant digits, as highlighted in the table. For the final wordline, both pairs of binary digits are equal to $11_2$. Under this condition, the ABC decoding is made from the two implied digits $00_2$, again as highlighted in the table.

The above-described algorithm can be extended to any number of address bits, odd or even. In the case of an odd number of address bits, an implied most-significant digit equal to $0_2$ is utilized.

As will be understood by those of ordinary skill in the art, there are multiple possibilities for the reordering of the wordlines. The important requirement is that a logical address decoded as A must correspond to a physical wordline that corresponds to A. This is likewise true for logical addresses decoded as B or C. For example, the logical address column of Table 2 could be replaced with the sequence 0,1,2,4,5,6,8,9,10,3,7,11,12,13,14,15.

The above-described decoding algorithm requires two distinct logical functions. The first logic function, LF-1, determines which pair of bits of the logical address to select for the ABC decoding. The second logic function, LF-2, is then simply a multiplexer that selects one bit pair according to the results of the first logic function. The selected bit pair is already a BET representation of the three states A, B, C. A third logic function, LF-3, may be used to decode this bit pair into an alternate BET representation. For example, three binary digits may be used to express the ternary result such that $001_2$, $010_2$, $100_2$ correspond to A, B, C respectively.

Table 3 of FIG. 6 is a truth table for Logic Function LF-1 for an n-bit input address. $S_0$ active corresponds to $A_1,A_0$ selected for ABC decoding, $S_1$ corresponds to $A_3,A_2$ selected, $S_2$ active corresponds to $A_5,A_4$ selected for decoding, and so forth. For even n, $S_x$ corresponds to $A_{n-1},A_n$ selected for decoding, where $A_{n=1},A_n$ are implied address bits equal to $00_2$. For odd n, $S_x$ corresponds to $A_n,A_{n+1}$, where $A_n$ is an implied address bit equal to $0_2$.

Figure 7:
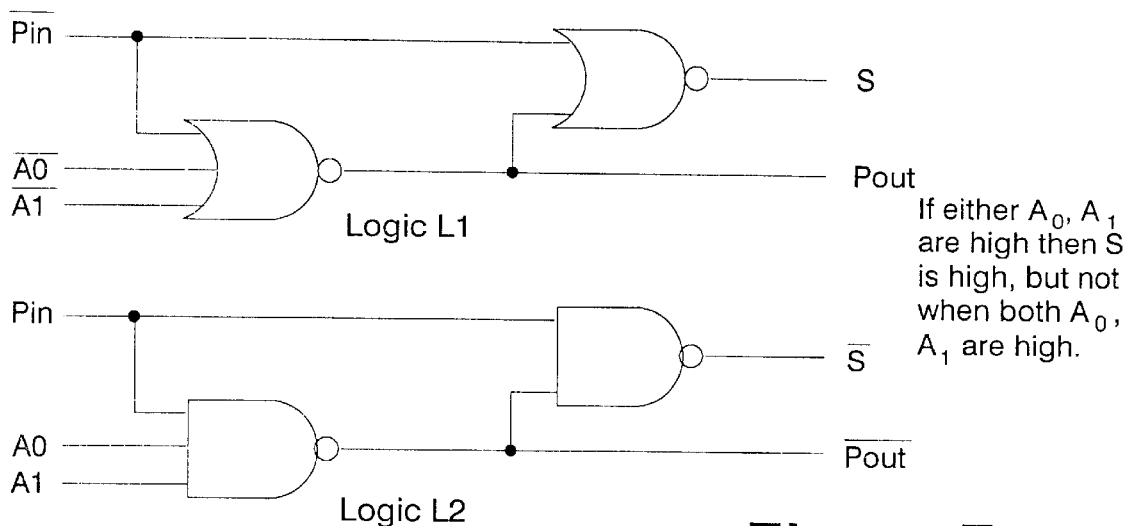
FIG. 7 shows two logical building blocks that can be utilized to produce the logic function of FIG. 6.
Figure 8:
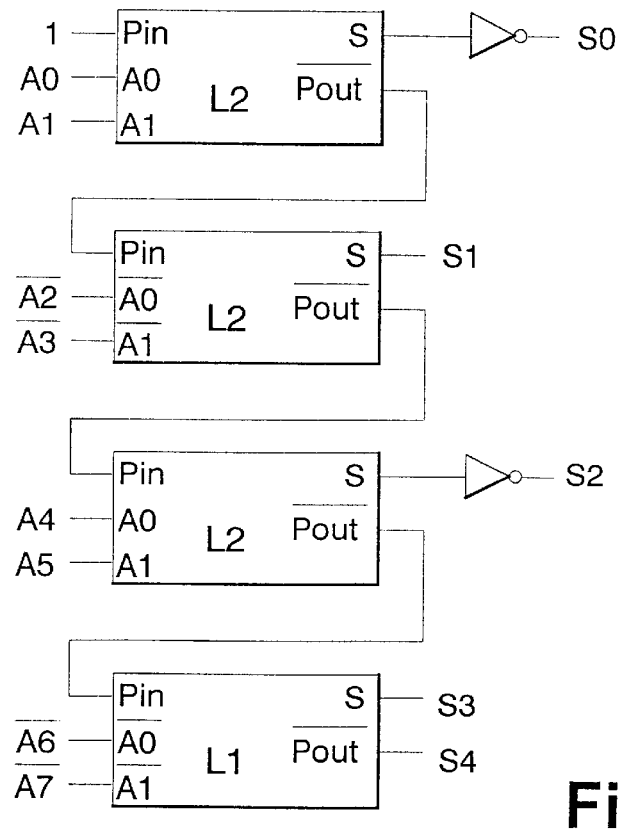
FIG. 8 shows a logic circuit for accomplishing the function of FIG. 6 for an 8-bit address.
Figure 9:
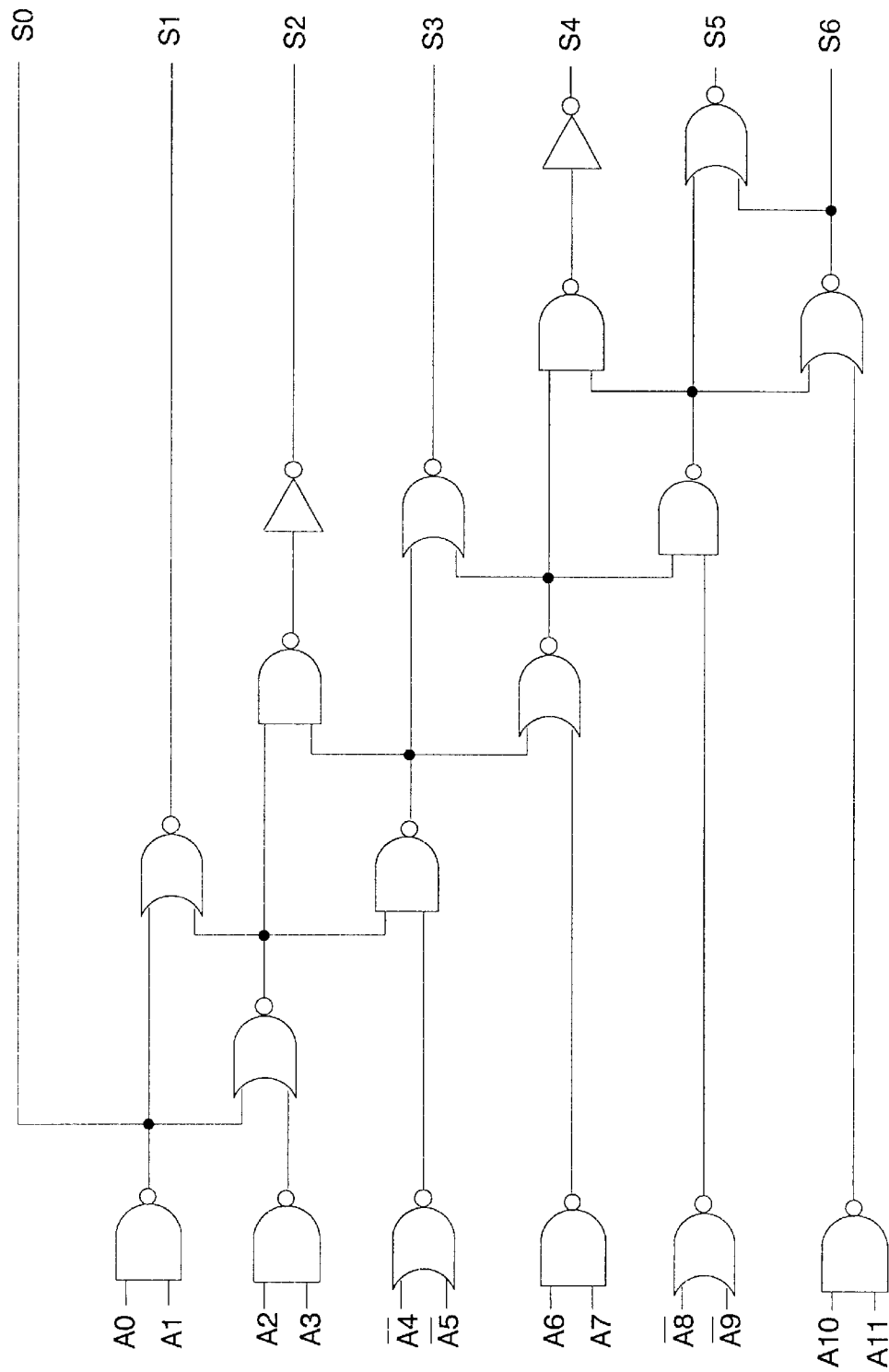
FIG. 9 shows an alternate logic circuit for producing the function of FIG. 6.

FIG. 7 shows two logical building blocks L1 and L2 that can be utilized to produce Logic Function LF-1. Using the fundamental logic blocks L1 and L2, any number of input address bits can be evaluated for determination of the proper bit-pair to be selected for the ABC decoding. FIG. 8 shows, as a specific example, how this can be accomplished for an 8-bit address. An alternative logic circuit for Logic Function LF-1 is shown in FIG. 9. In this instance, a 12-bit input address is assumed. As those of ordinary skill in the art will recognize, there are many other possible logic circuits that fulfill the requirements of Logic Function LF-1 such that the truth table of FIG. 6 is satisfied.

Figures 10, 11:
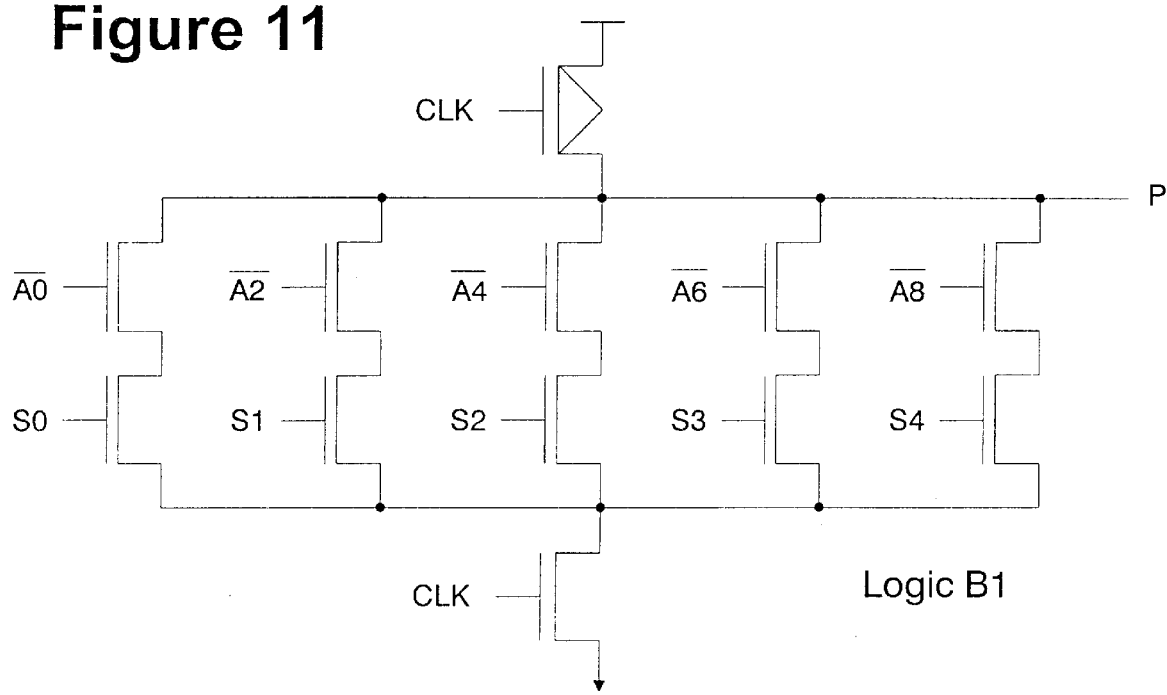
FIG. 10 is a truth table showing a second logic function used in the preferred embodiment of this invention.
FIG. 11 illustrates logic circuitry for producing the function of FIG. 10.
Figure 12:
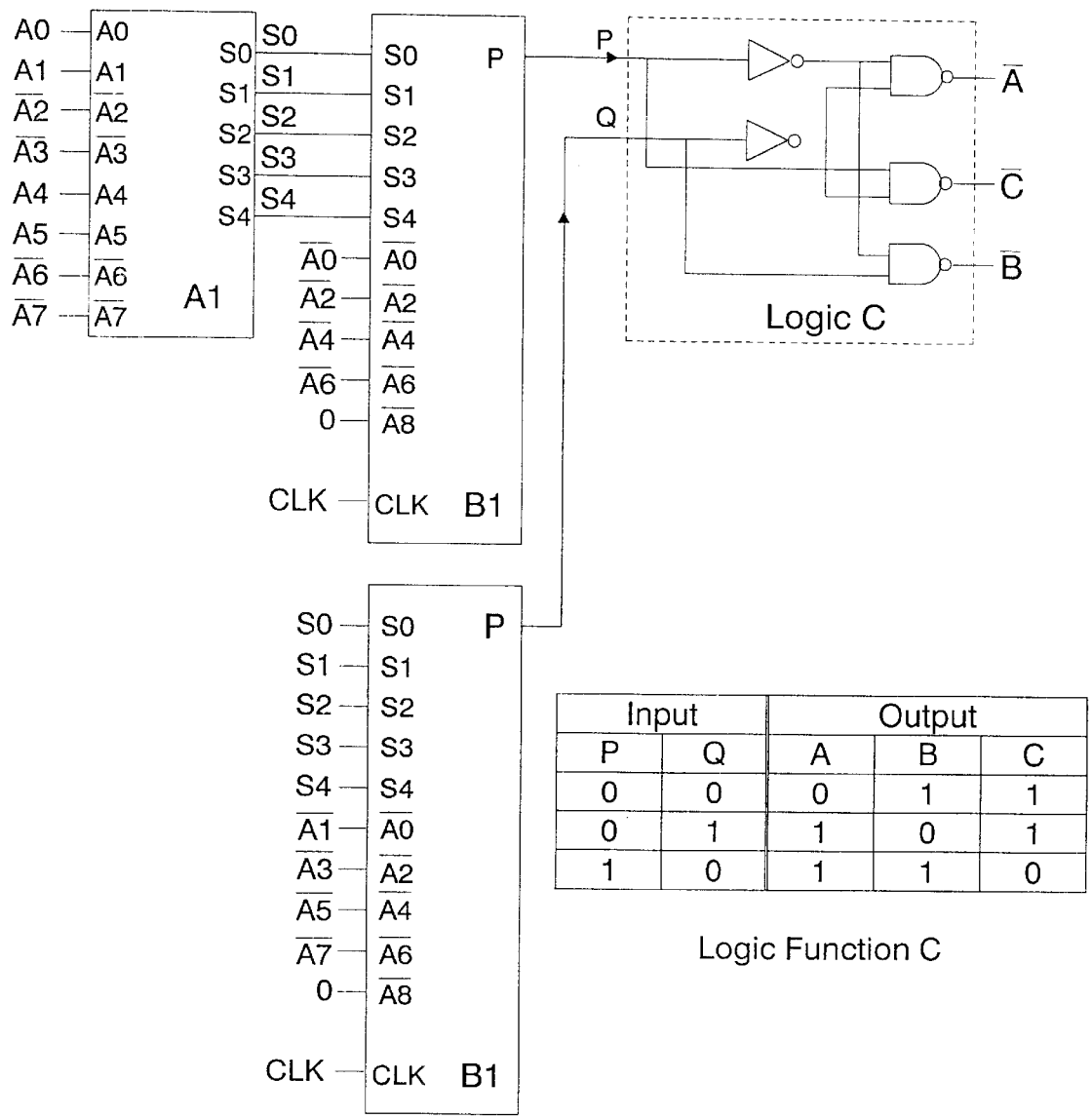
FIG. 12 shows the results of combining the logic functions of FIGS. 6 and 10.

Logic Function LF-2 is simply a pair of multiplexers as shown in the truth table of FIG. 10. One embodiment of this multiplexer for the case of an 8-bit address is shown in FIG. 11 using clocked CMOS technology. It should be noted that a multiplexer can be designed to accept any number of inputs and that there are many possible embodiments of a multiplexer that satisfy the truth table of FIG. 10. FIG. 12 shows the combined Logic Functions LF-1 and LF-2, which produce a 2-bit BET decoding for the case of an 8-bit input address. FIG. 12 also shows Logic Function LF-3, which converts the 2-bit BET output from Logic Function LF-2 into a 3-bit BET representation.

Figure 13:
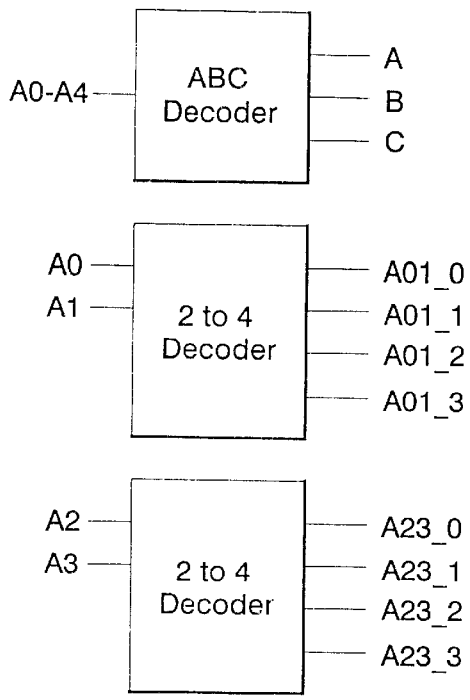
FIG. 13 shows a logic circuit for reordered wordline decoding when a predecoding and pass-logic is used.
Figure 14:
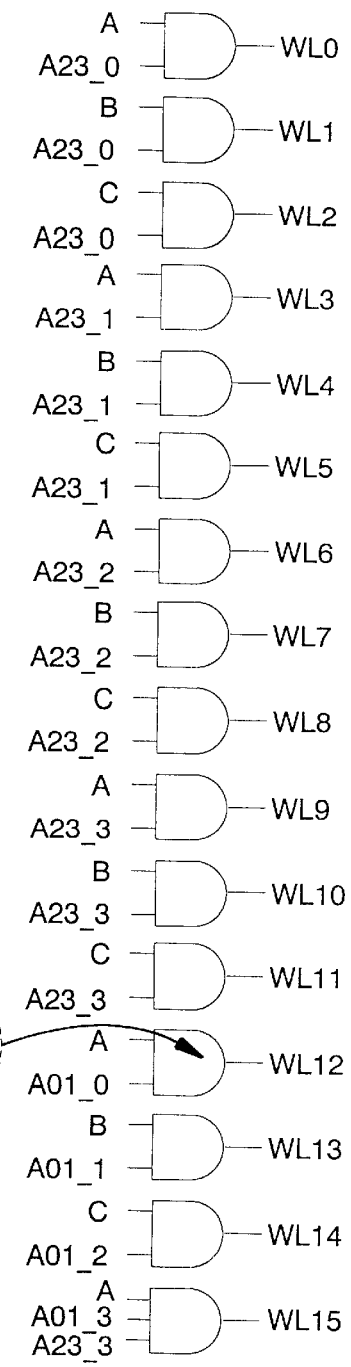
FIG. 14 is a detailed illustration of one of the AND gates of the circuit of FIG. 13.

The ABC decoder of FIG. 12 may also be used to simplify the reordered wordline decoding when a predecoding and pass-logic is used. FIG. 13 demonstrates this application using the 4-bit address example as in FIG. 7. The AND gates that generate the wordline signals are shown in FIG. 14 as pass-logic. Using the ABC decoder output as the input to the PFET source simplifies the wiring of the decoder.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An integrated circuit memory device comprising:

an arrangement of physical wordlines, WL0–WLn, arranged such that each wordline is addressed by a plurality of pairs, An+1, An, of logical row address bits, such that at least one pair of logical row address bits, corresponding to physically adjacent wordlines Wlm, Wlm+1, Wlm+2 in succession, cycles between binary states which encode the ternary results A, B and C in succession; and further wherein the ternary results A, B or C are used to determine which two bitlines of a possible three bitlines are selected by a multiplexer which connects the bitlines to a sense amplifier for determining the state of a bit stored in a memory cell accessed by an activated wordline and a selected bitline.

2. The integrated circuit memory device of claim 1, wherein said ternary results A, B and C are respectively encoded by said binary states of said pair of logical row address bits, said binary states being "00 ," "01 ," and "10" respectively.

3. The integrated circuit memory device of claim 1, wherein, for different groups of the wordlines, different pairs of logical row address bits cycle between the binary states that encode the ternary results A, B and C in succession.

4. The integrated circuit memory device of claim 3, further including a logic block for identifying, from the address bits of the wordlines, the pair of bits of the addresses that cycle between said binary states.

5. A method of managing an integrated circuit memory device having a multitude of wordlines, WL0–WLn, arranged in a given physical order, the method comprising the steps:

addressing the wordlines such that each wordline is addressed by a plurality of pairs, An+1, An, of logical row address bits, such that at least one pair of logical row address bits, corresponding to physically adjacent wordlines Wlm, Wlm+1, Wlm+2 in succession, cycles between binary states which encode the ternary results A, B and C in succession; and using the ternary results to determine which two bitlines of a possible three bitlines are selected by a multiplexer which connects the bitlines to a sense amplifier for determining the state of a bit stored in a memory cell accessed by an activated wordline and a selected bitline.

6. A method according to claim 5, wherein said ternary results A, B and C are respectively encoded by said binary states of said pair of logical row address bits, said binary states being "00 ," "01 ," and "10" respectively.

7. A method according to claim 5, wherein, for different groups of the wordlines, different pairs of logical row address bits cycle between the binary states that encode the ternary results A, B and C in succession.

8. A method according to claim 7, further including the step of using a logic block for identifying, from the address bits of the wordlines, the pair of bits of the addresses that cycle between said binary states.

9. A program storage device readable by a machine, tangibly embodying a program of instructions executable by the machine to perform method steps for managing an integrated circuit memory device having a multitude of wordlines, WL0–WLn, arranged in a given physical order, said method steps comprising:

addressing the wordlines such that each wordline is addressed by a plurality of pairs, An+1, An, of logical row address bits, such that at least one pair of logical row address bits, corresponding to physically adjacent wordlines Wlm, Wlm+1, Wlm+2 in succession, cycles between binary states which encode the ternary results A, B and C in succession; and using the ternary results to determine which two bitlines of a possible three bitlines are selected by a multiplexer which connects the bitlines to a sense amplifier for determining the state of a bit stored in a memory cell accessed by an activated wordline and a selected bitline.

10. A program storage device according to claim 9, wherein said ternary results A, B and C are respectively encoded by said binary states of said pair of logical row address bits, said binary states being "00 ," "01 ," and "10" respectively.

11. A program storage device according to claim 9, wherein, for different groups of the wordlines, different pairs of logical row address bits cycle between the binary states that encode the ternary results A, B and C in succession.

12. A program storage device according to claim 11, wherein said method steps further include the step of using a logic block for identifying, from the address bits of the wordlines, the pair of bits of the addresses that cycle between said binary states.

* * * * *